(12) United States Patent
Bulzacchelli et al.

(10) Patent No.: US 10,298,190 B2
(45) Date of Patent: May 21, 2019

(54) DYNAMIC PHASED ARRAY TAPERING WITHOUT PHASE RECALIBRATION

(71) Applicant: INTERNATIONAL BUSINESS MACHINES CORPORATION, Armonk, NY (US)

(72) Inventors: John F. Bulzacchelli, Somers, NY (US); Bodhisatwa Sadhu, White Plains, NY (US); Alberto Valdes Garcia, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 254 days.

(21) Appl. No.: 15/278,434

(22) Filed: Sep. 28, 2016

(65) Prior Publication Data

US 2017/0194707 A1    Jul. 6, 2017

Related U.S. Application Data

(63) Continuation of application No. 14/989,149, filed on Jan. 6, 2016, now Pat. No. 9,531,086.

(51) Int. Cl.
*H03G 3/30* (2006.01)
*H01Q 21/22* (2006.01)
(Continued)

(52) U.S. Cl.
CPC ............ *H03G 3/3036* (2013.01); *H01Q 1/523* (2013.01); *H01Q 1/525* (2013.01); *H01Q 3/28* (2013.01); *H01Q 3/36* (2013.01); *H01Q 21/22* (2013.01); *H03F 3/19* (2013.01); *H03F 3/195* (2013.01); *H03F 3/45085* (2013.01); *H04B 1/48* (2013.01); *H03F 2200/294* (2013.01); *H03F 2200/451* (2013.01); *H04B 7/0617* (2013.01)

(58) Field of Classification Search
CPC ...... H03G 3/3036; H01Q 1/523; H01Q 1/525; H01Q 3/28; H01Q 3/36; H01Q 21/22; H03F 3/19; H03F 3/195; H03F 3/45085; H04B 1/48
USPC ........................................................ 342/372
See application file for complete search history.

(56) References Cited

U.S. PATENT DOCUMENTS 4,335,361 A    6/1982 Acker
4,494,212 A    1/1985 Muellner
(Continued)

FOREIGN PATENT DOCUMENTS

EP    1255351 A1    11/2002
WO    0126218 A1    4/2001
WO    2011024598 A1    3/2011

OTHER PUBLICATIONS

List of IBM Patents or Patent Applications Treated as Related dated Sep. 28, 2016, 2 pages.
(Continued)

*Primary Examiner* — Harry K Liu
(74) *Attorney, Agent, or Firm* — Tutunjian & Bitetto, P.C.; Daniel Morris

(57) ABSTRACT

A method for phased array tapering includes setting a gain at a phase-invariant variable gain amplifier in each of a plurality of front-ends of a phased array transceiver to perform tapering of beam pattern side lobes. A resistance in the phase-invariant variable gain amplifier is set to provide a phase shift that is independent of gain.

17 Claims, 11 Drawing Sheets

(51) Int. Cl.

| | |
|---|---|
| *H01Q 3/28* | (2006.01) |
| *H01Q 3/36* | (2006.01) |
| *H03F 3/19* | (2006.01) |
| *H03F 3/45* | (2006.01) |
| *H04B 1/48* | (2006.01) |
| *H01Q 1/52* | (2006.01) |
| *H03F 3/195* | (2006.01) |
| *H04B 7/06* | (2006.01) |

(56) References Cited

U.S. PATENT DOCUMENTS

| | | |
|---|---|---|
| 4,819,000 A | 4/1989 | Meyer |
| 5,017,928 A | 5/1991 | Haupt et al. |
| 5,077,541 A | 12/1991 | Gilbert |
| 6,750,713 B1 | 6/2004 | Wyszynski |
| 7,332,967 B2 | 2/2008 | Rogers et al. |
| 8,787,850 B2 * | 7/2014 | Bockelman ............ H03F 1/086 330/292 |
| 2006/0164164 A1 * | 7/2006 | Rogers ..................... H03F 1/14 330/252 |
| 2007/0132512 A1 | 6/2007 | Miyazaki et al. |
| 2008/0031382 A1 * | 2/2008 | Aoki ......................... H03C 5/00 375/300 |
| 2008/0246525 A1 * | 10/2008 | Bazes ............... H03K 3/356113 327/178 |
| 2009/0039955 A1 | 2/2009 | Hosoya |
| 2009/0108937 A1 | 4/2009 | Yamaguchi |
| 2009/0284315 A1 * | 11/2009 | Kobayashi ................ H03F 1/08 330/253 |
| 2011/0025280 A1 | 2/2011 | Kimura |
| 2011/0063169 A1 * | 3/2011 | Chen ..................... H01Q 3/267 342/368 |
| 2012/0008705 A1 * | 1/2012 | Lee ..................... H04B 1/0475 375/285 |
| 2012/0049961 A1 | 3/2012 | Ripley et al. |
| 2015/0145604 A1 | 5/2015 | Scott et al. |
| 2015/0205314 A1 | 7/2015 | Hayashi et al. |
| 2017/0063310 A1 | 3/2017 | Kim et al. |

OTHER PUBLICATIONS

Martinez Silva, M.J. et al., "Phase analysis of a variable gain amplifier controlled through matching networks" 4th International Conference on Electrical and Electronics Engineering, ICEEE 2007 (Sep. 5-7, 2007) pp. 221-224.

* cited by examiner

DYNAMIC PHASED ARRAY TAPERING WITHOUT PHASE RECALIBRATION

BACKGROUND

Technical Field

The present invention relates to phased array transceivers and, more particularly, to tapering in phased array systems to improve transmission and reception pattern characteristics.

Description of the Related Art

A phased array system uses an array of antenna elements for a single transmitter or receiver. By adjusting a phase shift between antenna elements, the gain of the entire array can be precisely directed during operation, making it possible to achieve high gains with pinpoint accuracy.

However, while the highest gain is focused on the main lobe of the array's emission pattern, side lobes may also exist. Side lobes represented waste in the potential gain of the antenna array, as gain that could be directed along the main lobe is instead oriented off to the side. In addition, side lobes create interference in undesired directions in transmitter mode and allow the reception of interfering signals from undesired directions in receiver mode.

In a phased array, the direction of the main lobe is set by the phase setting applied to each element. Tapering is used to control the side lobes by controlling the gain of an amplifier at each antenna element. Ideally, varying the gain at each element should not change the phase, otherwise the direction of the main lobe changes and/or sidelobes may be affected as well. Ideally, phase shifting in an element should not vary the gain. In practice, phase and gain adjustment are non-orthogonal, making calibration and tapering challenging. Variable gain amplifiers (VGAs) exhibit different phase for different gain settings and phase shifters typically show gain/loss variations with phase settings as well.

For these reasons, conventional systems determine a correct gain and phase iteratively, setting the gain and phase of antenna front-ends in turn until the desired overall gain and phase of the front-end is achieved. This decreases the responsiveness of the system and limits its ability to quickly adapt to changing needs. In addition, as the size and spatial resolution of the array increase, then the number of gain and phase settings needed increases in turn. For large systems, the memory demands can become impractical, particularly if they are deployed at small scale on an integrated circuit.

SUMMARY

A method for phased array tapering includes setting a gain at a phase-invariant variable gain amplifier in each of a plurality of front-ends of a phased array transceiver to perform tapering of beam pattern side lobes. A resistance in the phase-invariant variable gain amplifier is set to provide a phase shift that is independent of gain.

A system configured to control a phased array includes a gain control module configured to set a gain at the phase-invariant variable gain amplifier in each of a plurality of front-ends of a phased array transceiver to perform tapering of beam pattern side lobes. A resistance in the phase-invariant variable gain amplifier is set to provide a phase shift that is independent of gain.

A phased-array transceiver includes multiple front-ends. Each front-end includes a transmit path comprising a phase-invariant variable gain amplifier and a receive path comprising a phase-invariant variable gain amplifier. A control system has a gain control module configured to set a gain at the phase-invariant variable gain amplifiers in each of the plurality of front-ends to perform tapering of beam pattern side lobes. A resistance in each phase-invariant variable gain amplifier is set to provide a phase shift that is independent of gain.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide phase-invariant gain control for tapering. In the context of the present embodiments, "phase-invariant gain control" refers to a phase change caused by an amplifier, where that phase change is invariant across different gain settings. By making the phase shift of a variable gain amplifier invariant with respect to changes in gain, the number of different settings can be reduced and the responsiveness of the phased array system can be dramatically increased. Whereas in conventional systems, particularly at high frequencies (e.g., in the millimeter wave band) the phase of the amplifier may depend strongly on the gain setting, the present embodiments provide such amplifiers with greatly diminished or negligible phase dependency.

Figure 1:
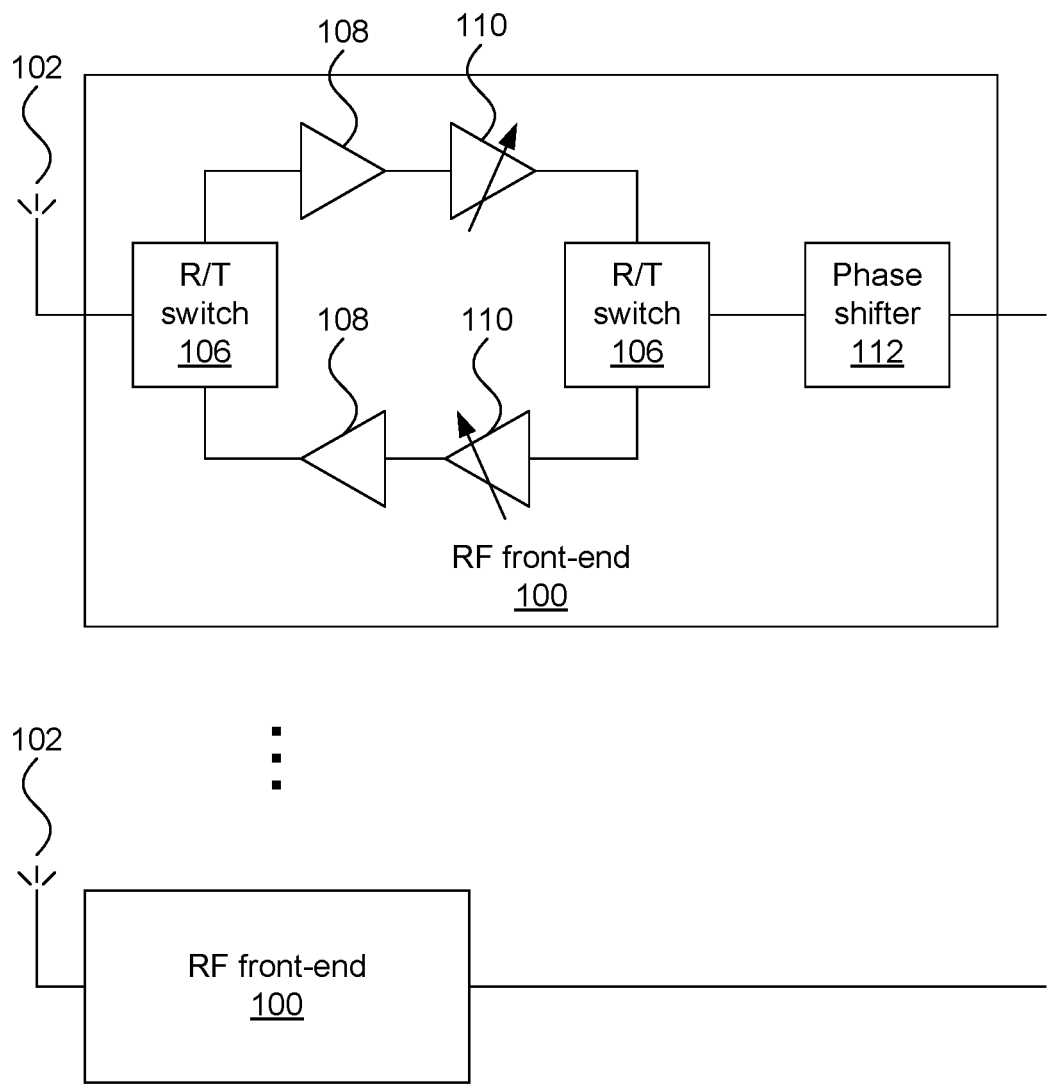
FIG. 1 is a diagram of a phased-array transceiver in accordance with the present principles.

Referring now to FIG. 1, a phased array system is shown having a plurality of radio frequency (RF) front-ends 100, each with a respective antenna element 102. Each RF front-end 100 includes a pair of receive/transmit switches 106 that switch between a receive path leading away from the antenna element 102 and a transmit path leading to the antenna element 102. Each of the transmit and receive paths include a low-noise amplifier (LNA) 108 and a phase-invariant variable gain amplifier (VGA) 110. A single phase shifter 112, which may have varying loss, controls the phase shift of the signals going to or coming from the antenna element 102 relative to the corresponding signals in the other RF front-ends 100.

The phase-invariant VGA 110 may be implemented as a single stage or may, alternatively, be implemented in multiple stages for improved gain range, noise figure, and linearity, as shown below. Each of the RF front-ends 100 has a similar structure, with settings for the VGA 110, the phase shifter 112, and the R/T switches 106 being determined externally as described below. In an alternative embodiment, there may be a phase shifter 112 between the antenna 102 and R/T switch 106. In a further embodiment, there may be a phase shifter 112 on each of the transmit and receive paths.

Figure 2:
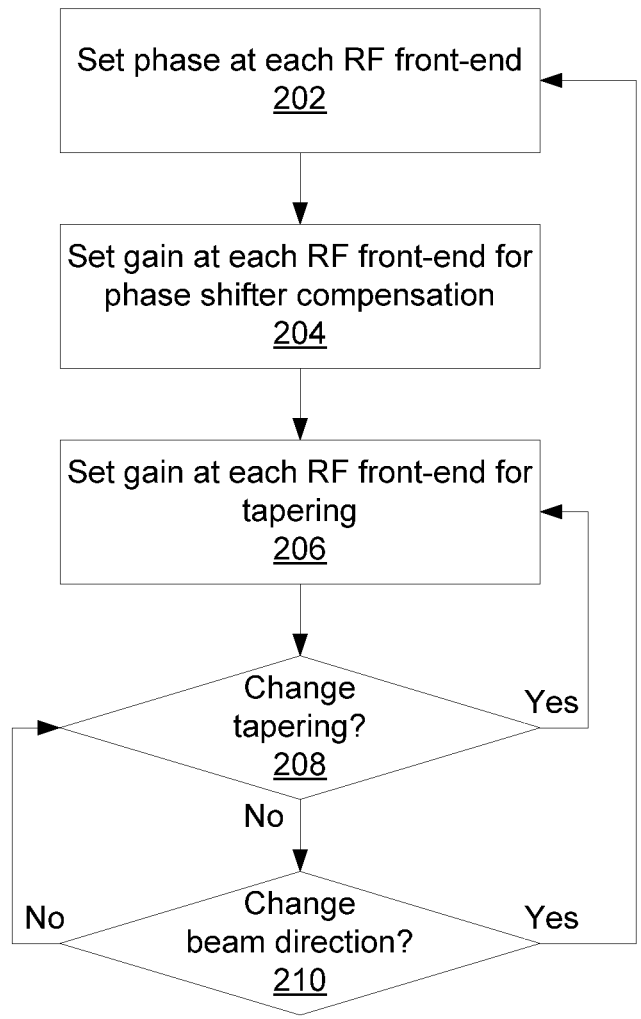
FIG. 2 is a block/flow diagram of a method for tapering control in a phased-array transceiver in accordance with the present principles.

Referring now to FIG. 2, a method for beam control in a phased-array system is shown. Block 202 sets a phase at each RF front-end 100 using the respective phase shifter 112. The phase set by block 202 is determined by the desired antenna beam pattern and may be derived during operation or stored in, e.g., a lookup table. Block 204 sets a gain at each RF front-end 100 using VGA 110 to compensate for gain at the phase shifter 112 while block 206 further adjusts the gain to provide tapering. If a change in tapering is needed at block 208, processing returns to block 206 to adjust the gain, and if a change in beam direction is needed in block 210, processing returns to block 202 to set a new phase. If no change is needed, transmission and reception can proceed as normal. It should be noted that the operation of switches may be performed without triggering a change in beam pattern or tapering—the linearity of RF propagation means that the beam pattern of the system will be the same regardless of whether the system is transmitting or receiving.

Figure 12:
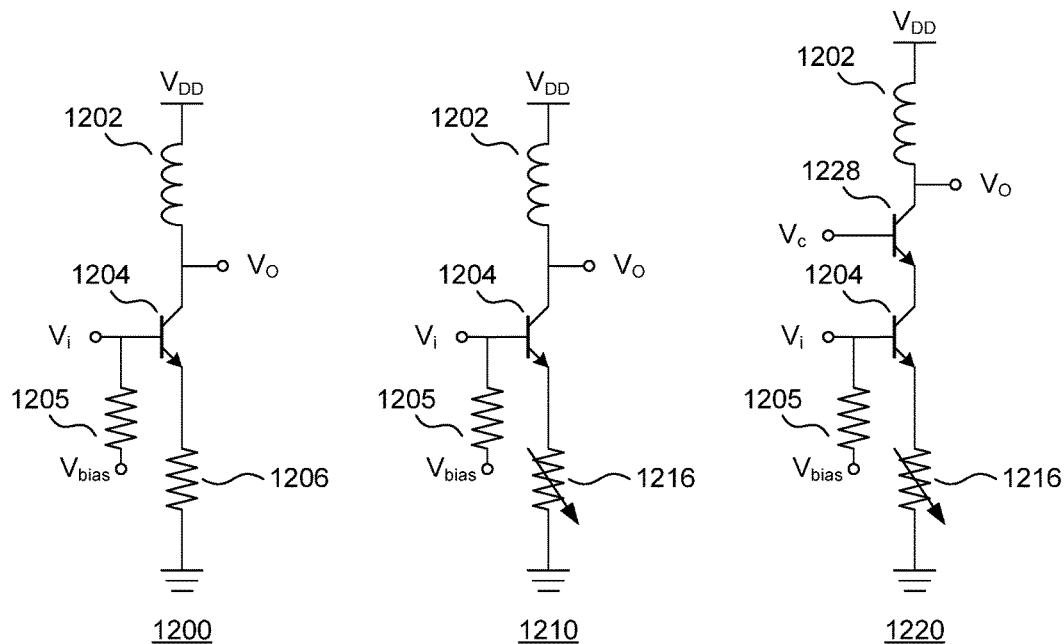
FIG. 12 is a circuit diagram of various embodiments of a phase-invariant variable gain amplifier in accordance with the present principles

Referring now to FIG. 12, three embodiments of a single-ended VGA 1200, 1210, and 1220 are shown. Each embodiment includes a load 1202 (shown in this example as an inductor to resonate with the capacitances of the input transistor 1204 and any further stages). In each embodiment, the higher the voltage applied to the input transistor 1204, the higher the gain of the respective amplifier. The input transistor is biased by a DC bias voltage $V_{bias}$ 1205 and receives an input voltage $V_i$. The bias voltage controls the DC current flowing through transistors 304 and as a result controls the gain of the single-ended VGA 1200, with a resistor having a value $R_e$ that is selected to compensate for the phase behavior of the transistor 1204. A second VGA 1210 is shown that has a similar structure to the first VGA 1200 but with a variable resistor 1216. The structure of this variable resistor 1216 will be described in greater detail below. In the third embodiment 1220, a second transistor 1228 is included with a respective DC biasing voltage $V_c$. The second transistor 1228 improves the reverse isolation between input and output nodes. Thus the introduction of a cascode does not interfere with the benefits provided by a degeneration resistor.

Figure 13:
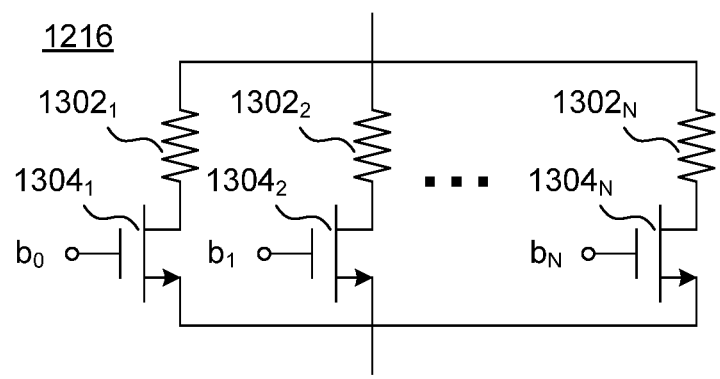
FIG. 13 is a circuit diagram of a variable degenerating resistor in accordance with the present principles.

Referring now to FIG. 13, a detailed diagram of the variable resistor 1216 is shown. The variable resistor 1216 includes N branches, each of which includes a respective resistor 1302 and a switch 1304 that is used to activate its respective resistance. The variable resistor 1216 therefore has a total effective resistance that is the combination of each of the activated resistances in parallel. This allows the resistance of the variable resistor 1216 to be tuned to provide a constant phase response in a VGA.

Figure 3:
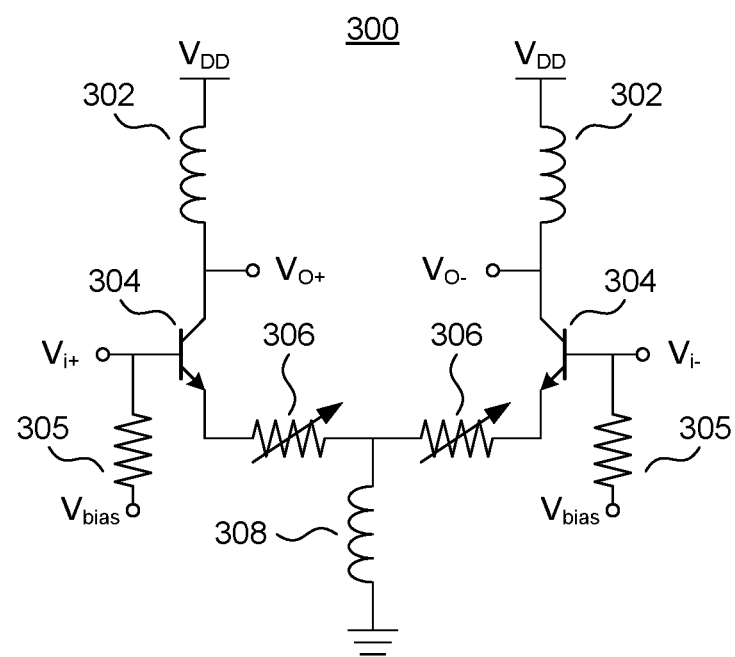
FIG. 3 is a circuit diagram of a phase-invariant variable gain amplifier in accordance with the present principles.

Referring now to FIG. 3, a schematic of a single-stage, phase-invariant VGA 300 is shown. The VGA 300 is anti-symmetric, taking a positive and negative inputs, $V_{i+}$ and $V_{i-}$, and producing a positive and negative output, $V_{O+}$ and $V_{O-}$. The gain control inputs 305 provide a bias voltage to control respective transistors 304 that are, e.g., bipolar junction transistors (BJTs) The higher the current through the collector of the transistors 304, the higher the gain of the VGA 300. Each branch of the VGA 300 includes a variable resistor 306 that controls the effect the VGA 300 has on the phase. It is therefore possible to create a VGA 300 with a resistance value ($R_E$) of the resistor 306 that produces a stable phase shift across the range of the VGA's gain adjustment ability. The details of selecting $R_E$ will be explained in detail below. It should be understood that a cascode structure may be used instead to achieve a higher gain and additional isolation.

A supply voltage $V_{DD}$ is provided through load inductors 302, which are used to resonate the capacitance of the input transistors 304 and the input capacitance of the next stage (if any). In general the load could be a resistor, an inductor in parallel with a capacitor, or a cascaded device followed by one or more passive devices. The load of the amplifier 300 is designed to provide a predetermined gain and frequency response. A tail inductor 308 connects the resistors 306 to ground. In an alternative embodiment, this tail inductor 308 may be replaced by a controllable current source. The tail inductor 308 forms a high-impedance to improve common-mode rejection. With the tail inductor 308, the common gain is much lower than the differential-mode gain. If a current source is used instead of the tail inductor 308, the current source implements the high impedance at the common node and at the same time provides further gain control. In this case, the DC voltage at the base of the input transistors 304 would remain constant. In either case, the gain control mechanism is ultimately implemented through collector current of the input transistors.

Each of the above embodiments uses a resistance that is selected to provide a relatively constant phase shift between the output and the input of the VGA, across the different gain settings of the VGA. The effective transconductance of an amplifier in the single-sided embodiments of FIG. 12, measured at the collector of transistor 1204 is given as:

$$g_{m,eff} = \frac{g_{m,i}}{\{1 + g_{m,i}R_e + (r_b + R_e) \cdot j\omega(C_{be,par} + \tau_B g_{m,i})\}}$$

where $g_{m,i}$ is the intrinsic device transconductance, $R_e$ is the resistance of the degeneration resistor 1206/1216 external to the transistor 1204, $r_b$ is the base resistance of the transistor 1204, $\omega$ is the frequency of operation, $C_{be,par}$ is the $g_{m,i}$ independent part of the base-emitter capacitance, and $\tau_B$ is the base transit time of the transistor 1204. When the value of $g_{m,i}$ changes (e.g. by varying the base to emitter voltage) then $g_{m,eff}$ and the gain of the amplifier change as well, realizing the variable gain function of the amplifier. Normally, the phase of $g_{m,eff}$ (and hence the phase of the VGA) will change with $g_{m,i}$ as well which is undesirable in some applications as explained above. In one embodiment, it can be shown from the equation above that if:

$$R_e = \frac{\tau_b}{C_{be,par}}$$

then the phase of $g_{m,eff}$ will not depend on $g_{m,i}$, and hence the phase of the amplifier will remain relatively constant across gain settings.

Figure 4:
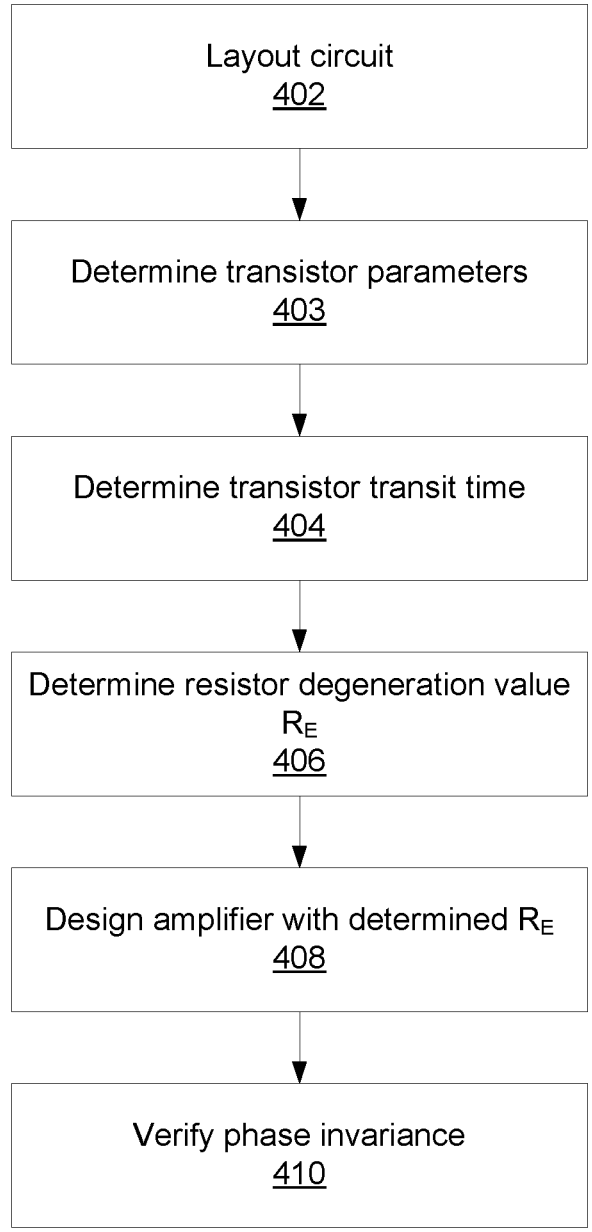
FIG. 4 is a block/flow diagram of a method of designing a single-stage, phase invariant variable gain amplifier in accordance with the present principles.

Referring now to FIG. 4, a method of designing a single-stage, phase-invariant VGA is shown. Block 402 lays out the general circuit, including the transistors 304. Block 403 obtains the BJT's intrinsic transconductance, resistance and capacitance values from simulation, and block 404 then determines the transistor base transit time. Based on these quantities, block 406 determines a resistor degeneration value $R_E$, where $R_E$ is equal to the ratio of the transit time and the $g_m$-independent base to emitter capacitance—notably, parasitics between, e.g., metal contacts and other incidental components do not play a significant role. Block 408 then designs the single-stage, phase-invariant VGA using the determined resistance value RE. Block 410 then verifies the phase invariance by, e.g., simulating the complete circuit and varying the gain to determine the degree to which the phase varies.

Figure 5:
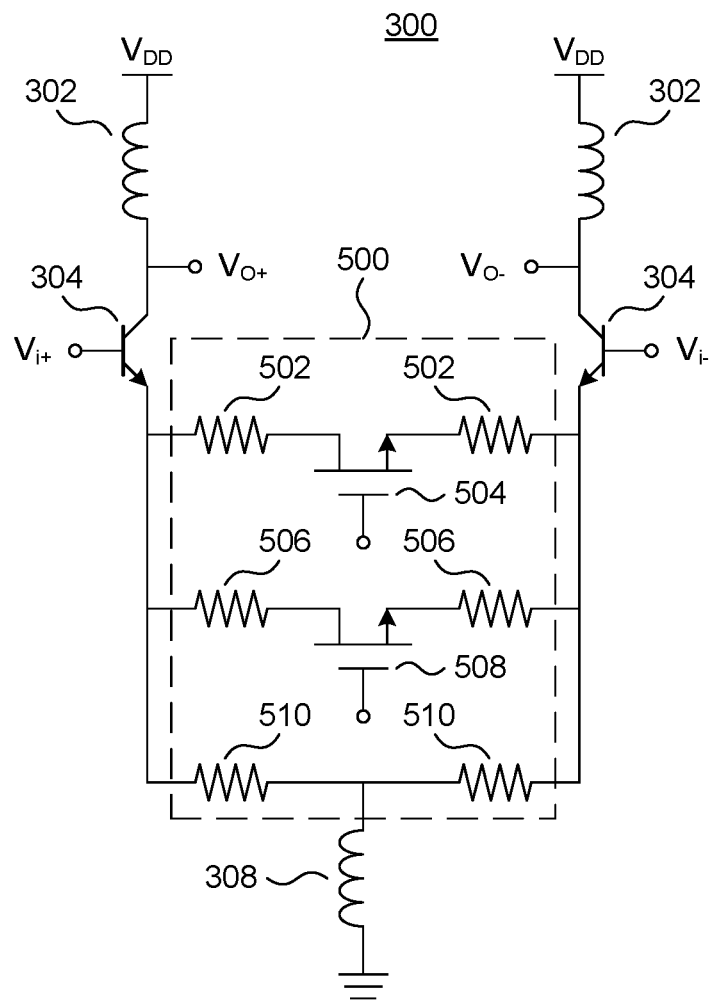
FIG. 5 is a circuit diagram of a phase-invariant variable gain amplifier in accordance with the present principles.

Referring now to FIG. 5, a more detailed embodiment of the single-stage, phase-invariant VGA 300 is shown. Instead of the variable resistors 306, an actively controlled resistor network 500 is shown. The resistor network 500 provides a tunable effective resistance, with a different resistance between the emitters of the switches 504 and 506 depending on whether the switches 504 and 506 are open or closed. The effective resistance degeneration values result in different slopes of phase versus gain. The values of resistors 502, 506, and 510 are selected to control that slope, between positive slope, no slope, negative slope, all-positive but varying in degree, all-negative but varying in degree, or constant slope. This provides for many different phase dependence configurations and can provide correction for process variations.

Figure 6:
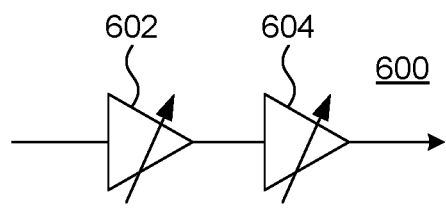
FIG. 6 is a diagram of a two-stage, phase-invariant variable gain amplifier in accordance with the present principles.

Referring now to FIG. 6, a general diagram of a two-stage, phase-invariant amplifier 600 is shown. The two-stage amplifier 600 includes a first VGA stage 602 and a second VGA stage 604. One of the two stages is designed independently of phase considerations, while the second is designed to compensate for phase dependencies in the first stage—the latter is referred to herein as the "phase-varying" or "phase-compensating" stage and has a phase response that is controlled to be the opposite of that in the independent stage. In one embodiment, the first stage 602 is designed independently of phase considerations and the second stage 604 is designed to compensate for the phase dependencies of the first stage 602. In a second embodiment, the second stage 604 is designed independently of phase considerations and the first stage 602 is designed to compensate for the phase dependencies of the second stage 604. The two-stage amplifier 600 provides more degrees of freedom and a larger gain range than the single-stage amplifier 300 while maintaining phase invariance.

Regardless of which stage is selected as the phase-varying stage, the structure of FIGS. 3 and 5 may be used, with a value of $R_E$ being selected to produce a phase dependence in the phase-compensating stage that is the opposite of that present in the independent stage. In one specific embodiment, where the first stage 602 is designed independent of phase considerations, the second stage 602 has the structure described in FIGS. 3 and 5 with a value of $R_E$ that provides an inverse phase dependence as compared to the first stage 602.

Figure 7:
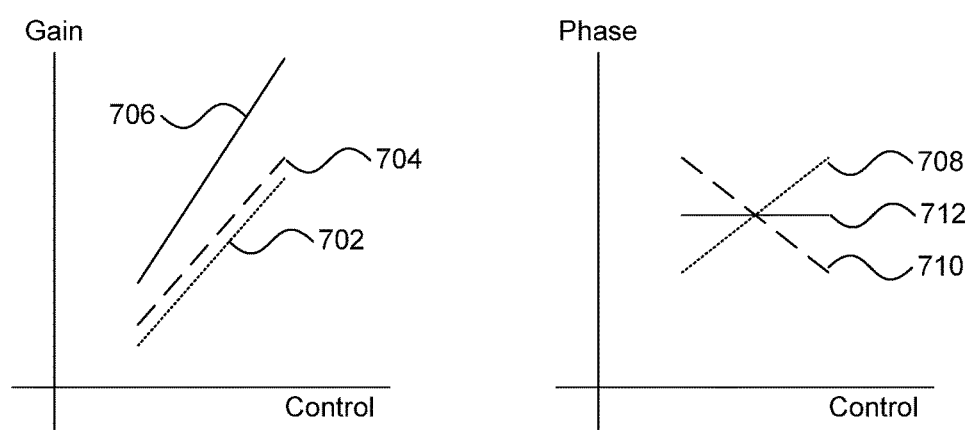
FIG. 7 is a diagram of phase and gain relationships in a two-stage, phase invariant variable gain amplifier in accordance with the present principles.

Referring now to FIG. 7, graphs showing the gain and phase relationships of the two stages are shown. A first graph shows gain on its vertical axis and a control signal on its horizontal axis, indicating the gain behavior of the VGAs 602 and 604. A first signal 702 represents the gain of the first stage 602 and a second signal 704 that represents the gain of the second stage 604, with a third signal 706 showing the gain of the two stages together.

In the second graph, the phase relationship of the two VGAs 602 and 604 is shown, with the vertical axis showing the phase of each stage and the horizontal axis shows the same control signal as in the first graph. A first signal 708 represents the phase dependence of the first stage 602, while a second signal 710 represents the phase dependence of the second stage 604. The sum of the two signals is shown as 712 and shows a flat response to the control signal, such that the effect of the two stages in combination is phase-invariant.

Figure 8:
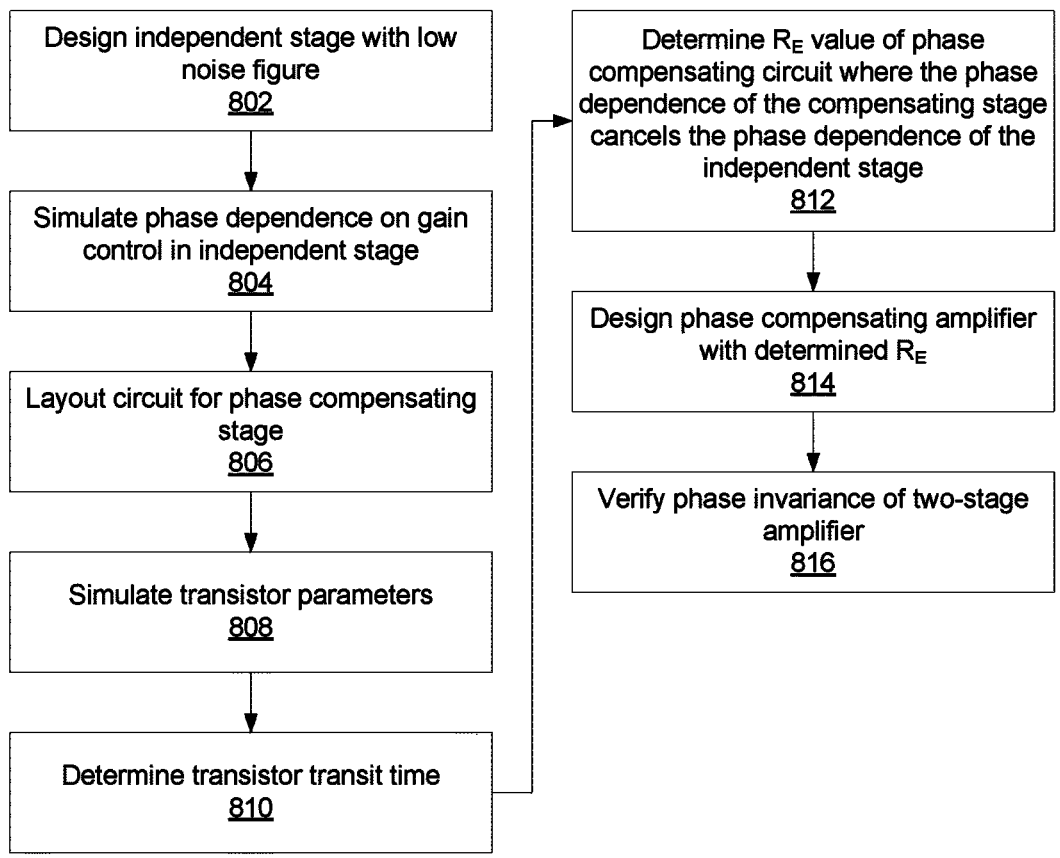
FIG. 8 is a block/flow diagram of a method of designing a two-stage, phase invariant variable gain amplifier in accordance with the present principles.

Referring now to FIG. 8, a method of designing a two-stage, phase-invariant VGA 600 is shown. Block 802 designs one stage that is independent of phase dependency considerations. This stage may be either the first stage 602 or the second stage 604 and should be designed to have a low noise figure. Block 804 simulates the phase dependence of the independent stage on gain control to determine its behavior. Block 806 then lays out the circuit for the phase compensating stage (which is the other of the first stage 602 and the second stage 604). Block 808 obtains the transistor's intrinsic transconductance, resistance and capacitance values from simulation of the phase compensating stage and block 810 then determines the transistor base transit time. Based on these quantities and the phase dependence of the independent stage, block 812 determines a resistor value $R_E$ where the phase dependence of the phase compensating stage cancels the phase dependence of the independent stage. Block 814 then designs the phase-compensating amplifier stage with the determined resistance value $R_E$. Block 816 verifies the phase invariance of the two-stage VGA 600 by, e.g., simulating both stages and varying the gain to determine the degree to which the output phase varies.

Figure 9:
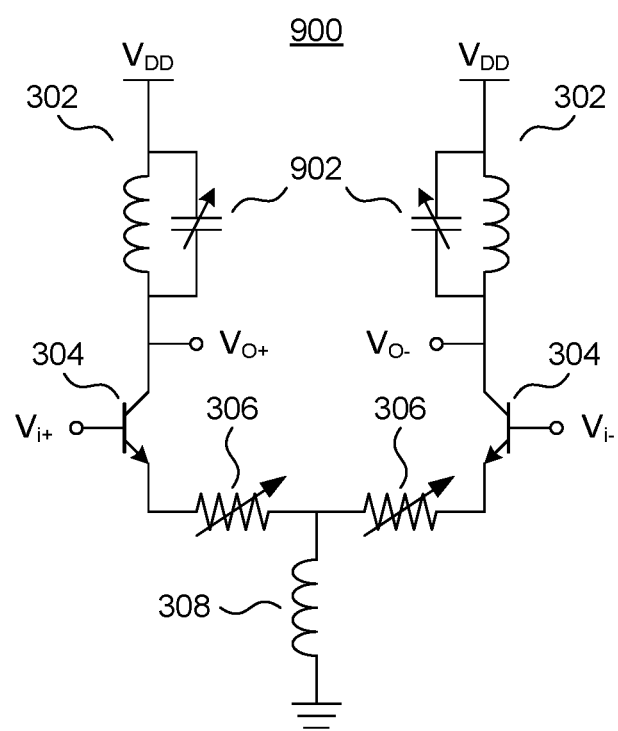
FIG. 9 is a circuit diagram of a phase-invariant variable gain amplifier and phase shifter in accordance with the present principles.

Referring now to FIG. 9, an alternative embodiment is shown of a differential VGA 900 that provides ±90 degrees of phase shift at a constant amplitude. This embodiment includes varactors 902 which, as their capacitance varies, changes the phase output with respect to the input from, e.g., +90 to −90 degrees. While the gain would normally change during such phase control, the variable resistors 306 of the present embodiments are designed to compensate for the gain variation without affecting the selected phase, producing a gain-invariant phase shifter. The variable resistors 306 may be designed according to the resistor network 500 or any other appropriate circuit. Thus the VGA 900 provides both phase control and gain control. In one embodiment, the VGA 900 may be controlled using autonomic feedback, where the power output of the VGA 900 is measured and used to control the input voltage at transistors 304 to maintain a constant desired gain.

Figure 10:
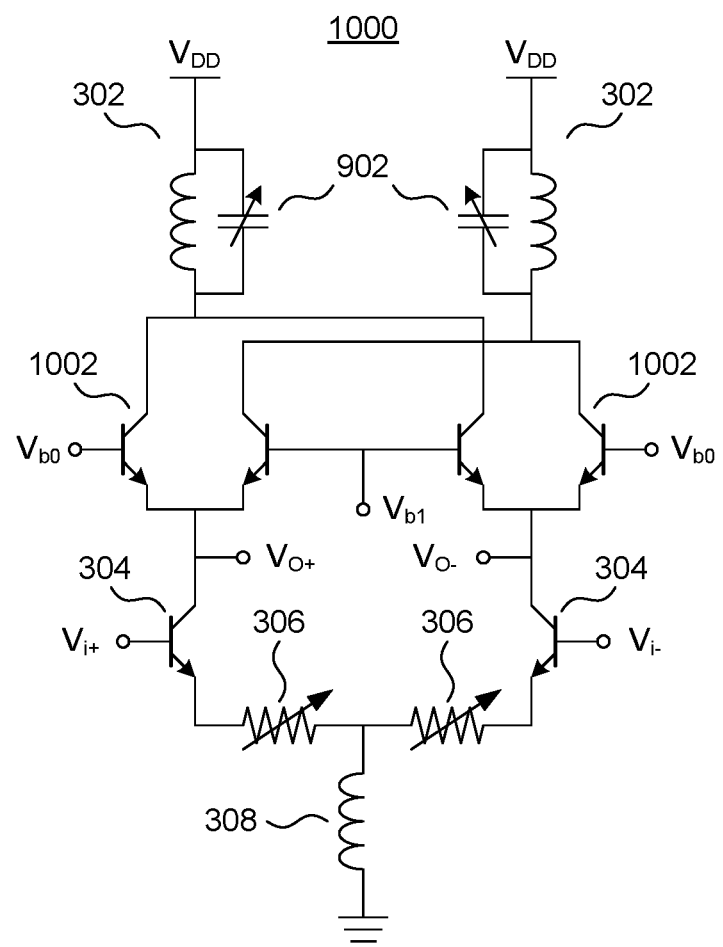
FIG. 10 is a circuit diagram of a phase-invariant variable gain amplifier and phase shifter in accordance with the present principles.

Referring now to FIG. 10, an alternative embodiment is shown that provides a gain-invariant 360° phase shifter 1000. The phase shifter 1000 includes two pairs of cascode transistors 1002 between the varactors 902 and the input transistors 304 of the 180-degree phase shifting VGA 900. The transistors 1002 exploit the differential nature of the VGA 1000 to invert the phase change by choosing whether $V_{b1}$ or $V_{b0}$ is high or low. Only one of the inputs $V_{b0}$ and $V_{b1}$ is active at one time, with the other being pulled to ground.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 11:
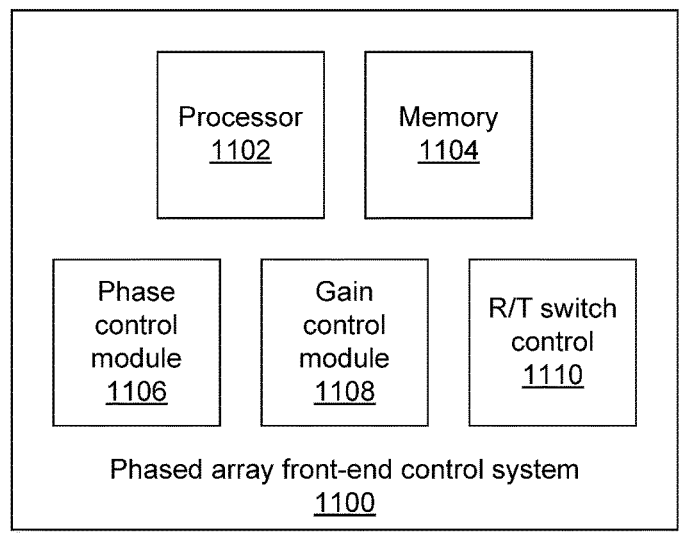
FIG. 11 is a block diagram of a phased array front-end control system in accordance with the present principles.

Referring now to FIG. 11, a system 1100 for controlling the phased-array front-ends 100 is shown. The system 1100 includes a hardware processor 1102 and memory 1104. The system 1100 further includes one or more functional modules. In one embodiment, the modules may be implemented as software that is stored in memory 1104 and executed by hardware processor 1102. In an alternative embodiment, the modules may be executed as one or more discrete hardware components, for example in the form of application specific integrated chips or field programmable gate arrays.

A phase control module 1106 controls the phase shifters 112 in accordance with a desired beam pattern. A gain control module controls the phase-invariant VGAs 110 to provide trimming. As described above in FIG. 2, the phase and gain may be adjusted as needed, but the iterative phase/gain refinement that is present in conventional systems is not performed in the present embodiments. Instead, because the VGAs 110 have a phase shift insensitive to gain, the phase and gain may be set independently of one another. An R/T switch control issues commands to the R/T switches 106 during operation to switch between transmit and receive modes.

Figure 14:
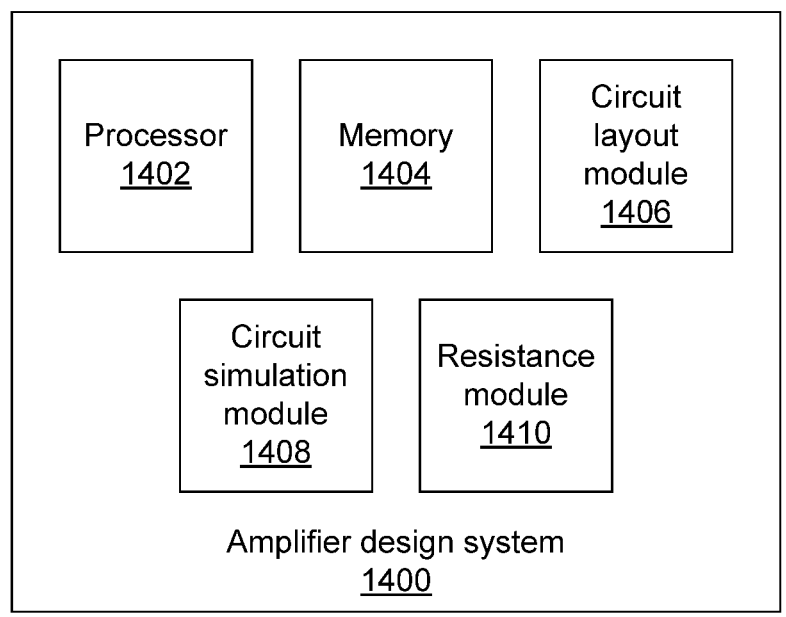
FIG. 14 is a block diagram of an amplifier design system in accordance with the present principles.

Referring now to FIG. 14, a system for designing a phase-invariant VGA is shown. The system 1400 includes a hardware processor 1402 and memory 1404. The system 1400 further includes one or more functional modules. In one embodiment, the modules may be implemented as software that is stored in memory 1404 and executed by hardware processor 1402. In an alternative embodiment, the modules may be executed as one or more discrete hardware components, for example in the form of application specific integrated chips or field programmable gate arrays.

A circuit layout module 1406 provides a circuit layout for a one-stage or two-stage VGA. A simulation module 1408 simulates the VGA, which for a single-stage embodiment includes simulating properties of the input transistor(s). For a two-stage embodiment, simulation further includes simulating the dependence of the phase of one stage on the gain of that stage. A resistance module 1410 calculates a suitable value for $R_E$, either for the single-stage VGA or for the phase-compensating stage of a two-stage VGA. The circuit layout module then employs the determined $R_E$ value to complete the VGA design.

Having described preferred embodiments of dynamic phased array tapering without phase recalibration (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for phased array tapering, comprising:
setting a gain at a phase-invariant variable gain amplifier in each of a plurality of front-ends of a phased array transceiver to perform tapering of beam pattern side lobes, wherein a resistance in the phase-invariant variable gain amplifier is proportional to a base transit time of an input transistor of the phase-invariant variable gain amplifier to provide a phase shift that is independent of gain.

2. The method of claim 1, wherein setting the gain at each phase-invariant variable gain amplifier comprises setting a direct-current collector current.

3. The method of claim 1, further comprising setting a pre-determined relationship between gain and phase shift by controlling the resistance.

4. The method of claim 1, wherein setting the gain comprises setting a first gain at a first stage of the phase-invariant variable gain amplifier and setting a second gain at a second stage of the phase-invariant variable gain amplifier.

5. The method of claim 4, wherein a dependency of a phase shift of the first stage on the gain of the first stage is equal to and opposite a dependency of a phase shift of the second stage on the gain of the second stage.

6. A system configured to control a phased array, comprising:
a plurality of front-ends of a phased array transceiver, each comprising a phase-invariant variable gain amplifier that includes an input transistor and a resistor;
a gain control module configured to set a gain at the phase-invariant variable gain amplifier in each of the plurality of front-ends to perform tapering of beam pattern side lobes, wherein a resistance of the resistor in each phase-invariant variable gain amplifier is proportional to a base transit time of the respective input transistor to provide a phase shift that is independent of gain.

7. The system of claim 6, wherein the gain control module is further configured to set a direct-current collector current to control the gain.

8. The system of claim 6, wherein the gain control module is further configured to control the resistance to control a relationship between gain and phase shift.

9. The system of claim 6, wherein the gain control module is further configured to set a first gain at a first stage of the phase-invariant variable gain amplifier and to set a second gain at a second stage of the phase-invariant variable gain amplifier.

10. The system of claim 9, wherein a dependency of a phase shift of the first stage on the gain of the first stage is equal to and opposite a dependency of a phase shift of the second stage on the gain of the second stage.

11. A phased-array transceiver, comprising:
a plurality of front-ends, each front-end comprising:
a transmit path comprising a phase-invariant variable gain amplifier that includes an input transistor and a resistor; and
a receive path comprising a phase-invariant variable gain amplifier that includes an input transistor and a resistor;
a control system, comprising:
a gain control module configured to set a gain at the phase-invariant variable gain amplifiers in each of the plurality of front-ends to perform tapering of beam pattern side lobes, wherein a resistance of the resistor in each phase-invariant variable gain amplifier is proportional to a base transit time of the respective input transistor to provide a phase shift that is independent of gain.

12. The phased-array transceiver of claim 11, wherein the gain control module is further configured to set a direct-current collector current to control the gains.

13. The phased-array transceiver of claim 11, wherein the gain control module is further configured to control the resistance to control a relationship between gain and phase shift.

14. The phased-array transceiver of claim 11, wherein the gain control module is further configured to set a first gain at a first stage of each phase-invariant variable gain amplifier and to set a second gain at a second stage of each phase-invariant variable gain amplifier.

15. The phased-array transceiver of claim 14, wherein a dependency of a phase shift of the first stage on the gain of the first stage is equal to and opposite a dependency of a phase shift of the second stage on the gain of the second stage.

16. The phased-array transceiver of claim 11, wherein each front-end further comprises a pair of switches configured to switch between the transmit path and the receive path.

17. The phased-array transceiver of claim 16, wherein each front-end comprises a respective phase-shifter for each of the transmit path and the receive path.

* * * * *